United States Patent [19]
Mann

[11] Patent Number: 5,881,121
[45] Date of Patent: Mar. 9, 1999

[54] ONE-PIN SHIFT REGISTER INTERFACE

[75] Inventor: Eric N. Mann, Issaquah, Wash.

[73] Assignee: Cypress Semiconductor Corp., San Jose, Calif.

[21] Appl. No.: 799,835

[22] Filed: Feb. 13, 1997

[51] Int. Cl.$^6$ .................................................. G11C 19/00
[52] U.S. Cl. ............................. 377/73; 372/26; 372/54
[58] Field of Search .................................. 377/54, 26, 73

[56] References Cited

U.S. PATENT DOCUMENTS

| | | | |
|---|---|---|---|
| 4,148,099 | 4/1979 | Lauffer et al. | 365/226 |
| 4,347,587 | 8/1982 | Rao | 365/189 |
| 4,683,555 | 7/1987 | Pinkham | 365/215 |
| 4,796,231 | 1/1989 | Pinkham | 365/189 |
| 4,801,871 | 1/1989 | Tada et al. | 324/73 |
| 5,033,067 | 7/1991 | Cole et al. | 377/54 |
| 5,057,840 | 10/1991 | Ledzius et al. | 341/144 |
| 5,339,079 | 8/1994 | Ledzius et al. | 341/144 |
| 5,483,566 | 1/1996 | O'Hara, Jr. et al. | 377/73 |

OTHER PUBLICATIONS

Dallas Semiconductor Silicon Serial No. DS2401, Aug. 30, 1995, pp. 1–9.

Dallas Semiconductor Application Note 74 Reading and Writing Touch Memories via Serial Interfaces, Mar. 24, 1995, pp. 1–40.

*Primary Examiner*—Margaret Rose Wambach
*Attorney, Agent, or Firm*—Maiorana & Acosta, P.C.; Christopher P. Maiorana

[57] ABSTRACT

A register using a single pin to provide two or more control signals (e.g., clock and data signals). The present invention decodes a three state input waveform to generate a clock/write signal and uses a three state clock waveform to generate a clock/read data signal. The present invention generally comprises a three-level receiver, a latch and an output driver to form a one-pin bidirectional interface used with a shift register. To write, the interface converts a three-level input signal into separate clock and data signals which drive the shift register. To read, the interface converts a bi-level input signal into a three-level output signal representing the output of the shift register. As a result, the present invention allows the programming of a device such as an erasable programmable read only memory (EPROM) in a clock chip while utilizing the fewest number of pins.

20 Claims, 3 Drawing Sheets

ONE-PIN SHIFT REGISTER INTERFACE

FIELD OF THE INVENTION

The present invention relates to shift registers generally and, more particularly, to a one-pin interface for reading and writing to a shift register.

BACKGROUND OF THE INVENTION

Conventional shift registers generally used three or more input/output (signal) pins to interface to a shift register. FIG. 1 illustrates such a shift register 10. The shift register 10 receives a clock signal CLK at input 12 from a clock pin CLK and a data in signal DIN at input 14 from a data in pin DIN. The shift register 10 generates a data out signal DOUT at output 16, which interfaces with external circuits through a data output pin DOUT. As a result, the shift register 10 generally uses all three separate pins to program a register. When only one signal pin is available for interfacing to the programming register requiring three signal pins is not allowed. Other limited pin devices may also find supporting three signal pins for programming an undesirable design constraint.

FIG. 2 illustrates an alternate shift register 20. The shift register 20 generally comprises an input 22 that receives a clock signal CLK, an input 24 that receives a data input signal DIN and an output 26 that presents a data output signal DOUT. The data output signal DOUT is coupled to the data input 24 through a buffer 28. The output 26 and the input 24 are coupled to a data input/output pin DI/O. The input 22 is coupled to a clock pin CLK. The buffer 28 is also coupled to a read/write pin R/W which receives a read/write signal that places the shift register 20 in either a read or write mode. The shift register 20 provides a bidirectional input/output pin DI/O but still uses three pins for operation.

Both the shift register 10 and the shift register 20 generally use three pins to interface for proper programming. As a result, a device having a limited pin count, such as a four pin device, which during programming has only one signal pin available (Vdd pin, Vss pin, Vpp programming voltage pin, signal pin) require a one pin shift register interface which combines clock and data functions.

SUMMARY OF THE INVENTION

The present invention provides a read and write shift register can use a single (I/O) pin to provide both clock and data signals. The present invention decodes a three state input waveform to generate a clock/write signal and uses a three state clock waveform to generate a clock/read data signal. The present invention generally comprises a three-level receiver, a latch and an output driver to form a bidirectional interface used with a shift register. To write, the interface converts a three-level input signal into separate clock and data signals which drive the shift register. To read, the interface converts a bi-level input signal into a three-level output signal representing the output of the shift register. As a result, the present invention allows the programming of a device such as an erasable programmable read only memory (EPROM) in a clock chip while utilizing the fewest number of pins.

The objects, features and advantages of the present invention include providing an interface that allows reading and writing of data to a register using only a single pin to: generate a clock and data signal from a three-level input, write data into a shift register and read data from a shift register. The register may be implemented as an information storage and retrieval register, a pattern generation and modulation register, a counter mask register, a command register or other types of registers. The present invention may be used to program limited pin count devices such as EPROMs.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
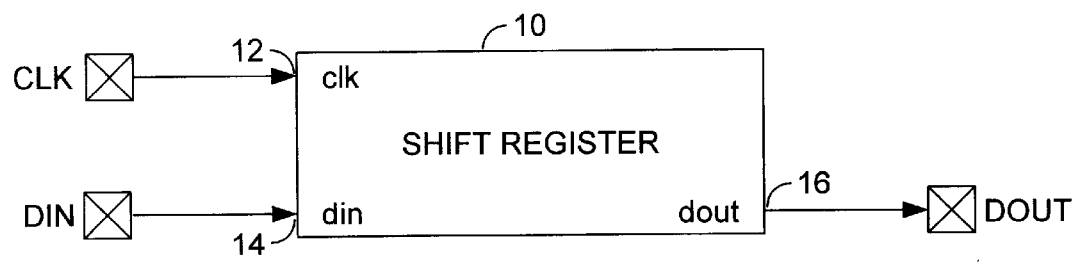
FIG. 1 is a block diagram of a conventional shift register.
Figure 2:
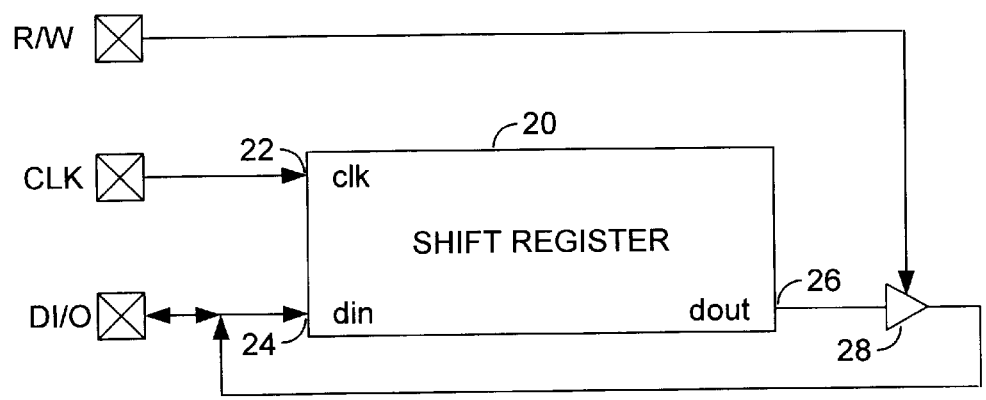
FIG. 2 is a block diagram of a conventional bi-directional shift register.
Figure 3:
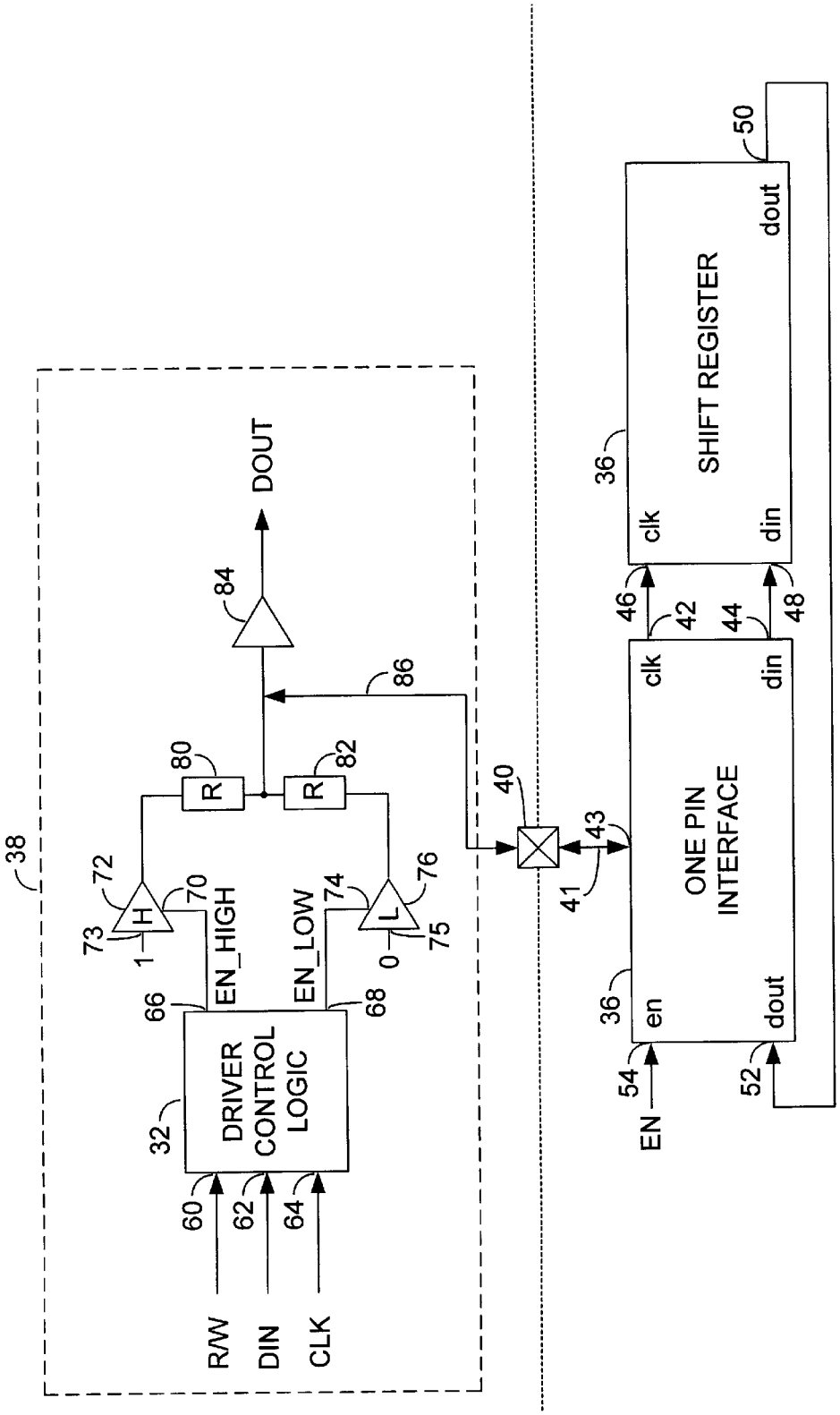
FIG. 3 is a block diagram of the present invention implemented in a circuit.

Referring to FIG. 3, a block diagram of a circuit 30 is shown in accordance with a preferred embodiment of the present invention. The circuit 30 generally comprises a three state programer logic 38, a one-pin interface 34 and a shift register 36. The three state programmer logic 38 generally presents a bidirectional signal through a pin 40 that is connected through a bus 41 to an input 43 of the one-pin interface 34. The one-pin interface 34 generally receives the signal from the pin 40 and presents a clock output CLK at an output 42 and a data in signal DIN at an output 44. The clock signal CLK and the data in signal DIN are generally presented to inputs 46 and 48 of the shift register 36. An output 50 presents a data out signal DOUT that is generally presented to an input 52 of the one-pin interface 34. As a result, the shift register 36 receives the required clock signal CLK and data input signal DIN to present the data out signal DOUT with the use of only a single pin 40. The one-pin interface 34 also has an input 54 that may receive an enable signal EN. The enable signal EN is generally an optional signal that may be used to enable additional optional circuitry external to the one-pin interface 34.

The driver control logic 32 generally provides one or more signals to the pin 40 to control the operation of the one-pin interface 34. The driver control logic 32 has an input 60 that generally receives a read/write signal R/W, an input 62 that generally receives a data input signal DIN and an input 64 that generally receives a clock signal CLK. The driver control logic 32 also has an output 66 and an output 68. The output 66 presents an enable signal $EN_{13}$ HI to an input 70 of a buffer 72. The output 68 presents an enable signal $EN_{13}$ LO to an input 74 of a buffer 76. The buffer 72 receives a logical "1" at an input 73 (by being coupled to a supply voltage) and presents a signal to an optional resistor 80. The buffer 76 generally receives a logical "0" (by being coupled to a ground voltage) at an input 75 and presents a signal to a resistor 82. The resistors 80 and 82 are generally coupled to a buffer 84 to present the data out signal DOUT. The resistors 80 and 82 are also coupled to the pin 40 through a bus 86.

The three state programming logic 38 provides a typical programming circuit to control the one pin interface 34. The buffer 72 is generally connected to a supply voltage VDD and the buffer 76 is generally coupled to ground. The optional resistors 80 and 82 may provide a resistor divider that is presented to the buffer 84. The enable signals $EN_{13}$ HI and $EN_{13}$ LO are generally presented to the buffer 84 and used to obtain four distinct output states VDD, VDD/2, GND and HI-Z. Generally, the first three output states are used for programming (or writing) and the states VDD/2 and HI-Z are used for reading.

When writing to the one pin interface 34, both the buffer 72 and the buffer 76 are enabled when the clock signal CLK is at a high state, causing the state of the interface pin 84 to generally be VDD/2. When the clock signal CLK goes low, the buffer 76 is disabled if the data is a "1", causing the voltage at pin 40 to transition high. If the data is a "0", the buffer 72 is generally disabled, causing the voltage at pin 40 to transition low. When the clock signal goes high, both the buffer 72 and the buffer 76 are enabled, causing the signal at pin 40 to transition back to the VDD/2 voltage. The general process for writing repeats until all the desired data is shifted into the internal shift register 36.

When reading from the shift register 36, both the buffers 72 and 76 are enabled when the clock signal CLK is high, forcing the signal pin to the VDD/2 condition. When reading, both buffers 72 and 76 are disabled when the clock is low. When the drivers float, the output of the shift register 36 drives pin 40 through the weak output driver in the one pin interface 34. The state of the pin 40 is buffered by buffer 84 and read by the programming circuits. When the clock signal CLK returns high, both drivers are again asserted, returning the signal pin 40 to VDD/2 which clocks the next data bit from the shift register 36. The process repeats until all desired data is read from the shift register 36. The logic of the driver control logic 32 may be described generally by the following TABLE 1:

TABLE 1

Driver Control Logic

| R/W | CLK | DIN | OUT | EN_HI | EN_LO |
|---|---|---|---|---|---|
| 1 | 1 | X | Mid | 1 | 1 |
| 1 | 0 | X | HI-Z | 0 | 0 |
| 0 | 1 | X | Mid | 1 | 1 |
| 0 | 0 | 1 | High | 1 | 0 |
| 0 | 0 | 0 | Low | 0 | 1 |

The driver control logic 32 may be implemented in a number of ways including, but not limited to, pass gates, programmable logic or software programmed on a microcontroller. The driver control logic 32 generally controls the signal $EN_{13}$ HI and the signal $EN_{13}$ LO which control the signals presented at the pin 40.

Figure 4:
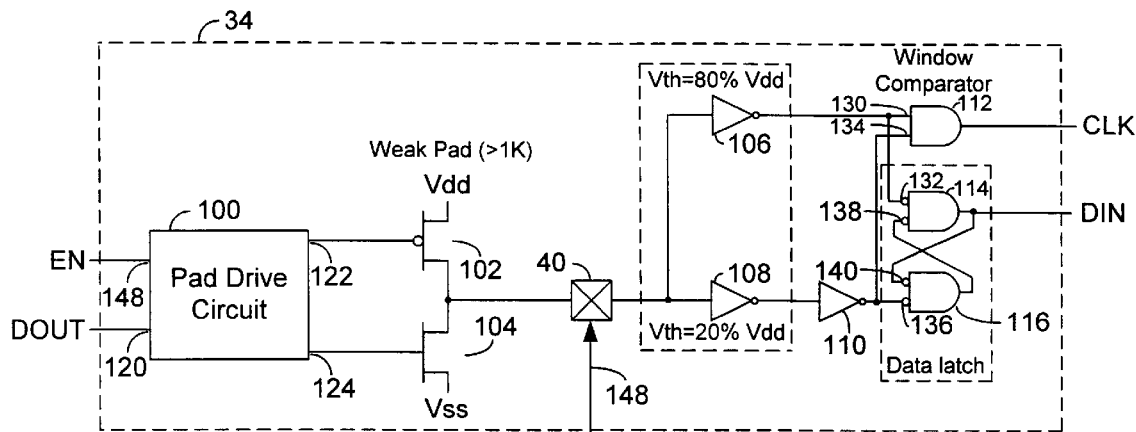
FIG. 4 is a block diagram of a preferred embodiment of the present invention.

Referring to FIG. 4, a more detailed diagram of the one-pin interface 34 is shown. The one-pin interface 34 generally comprises a pad drive circuit 100, a transistor 102, a transistor 104, the pin 40, an inverter 106, an inverter 108, an inverter 110, an AND gate 112, a NOR gate 114 and a NOR gate 116. The NOR gates 114 and 116 have been drawn with their deMorgan equivalent symbols to clarify circuit operation. The combination of AND gate 112 and three state receiver 144 generally functions as a comparator (e.g., a window comparator). The pad drive circuit 100 has an input 120 that generally receives the signal DOUT. The pad drive circuit 100 generally presents an output 122 to a gate of the transistor 102 (which may be implemented as a PMOS transistor) and an output 124 that is generally presented to the gate of the transistor 104 (which may be implemented as an NMOS transistor). The source of the transistor 102 is generally connected to a supply voltage VDD and the drain of the transistor 102 is generally connected to the drain of the transistor 104 as well as to the pin 40. The source of the transistor 104 is generally connected to a ground voltage VSS. The transistor 102 and the transistor 104 generally form a weak output driver, which is coupled to the pin 40.

The pin 40 is generally coupled to the inverters 106 and 108. The inverter 106 presents a signal to an input 130 of the AND gate 112 as well as to an inverted input 132 of the NOR gate 114. The inverter 108 presents a signal to the inverter 110. The inverter 110 presents a signal to an input 134 of the AND gate 112 as well as to an inverted input 136 of the NOR gate 116. The output of the NOR gate 116 is generally presented to an inverted input 138 of the NOR gate 114. The output of the NOR gate 114 generally presents the signal DIN. The output of the NOR gate 114 is also presented to the inverted input 140 of the NOR gate 116. The NOR gate 114 and the NOR gate 116 generally comprise a latch circuit 142.

An external circuit 146 may be coupled to the pin 40 through a bus 148. The external circuit 146 may perform a function other than the shift register function described. During such an alternate operation, an input 148 may be presented to the pad drive circuit 100 to receive an enable signal EN. The input 148 generally corresponds to the input 54 shown in FIG. 3.

The inverter 106 and the inverter 108 generally comprise a three level receiver 144 which is used to determine when a signal received at the input 120 is, in one example, within approximately 20% of Vdd or Vss. During these states, the clock signal CLK is generally de-asserted and the latch circuit captures the state of the data received at the input 120. Next, the input signal returns to the state VDD/2, which asserts the clock signal CLK. As a result, the data contained in the latch is shifted into the shift register 36. The inverter 106 may have a threshold (Vth) of 80% of VDD while the inverter 108 may have a threshold of 20% of VDD. However, the thresholds of the inverters 106 and 108 may be independently adjusted to meet the design criteria of a particular application.

Figure 5:
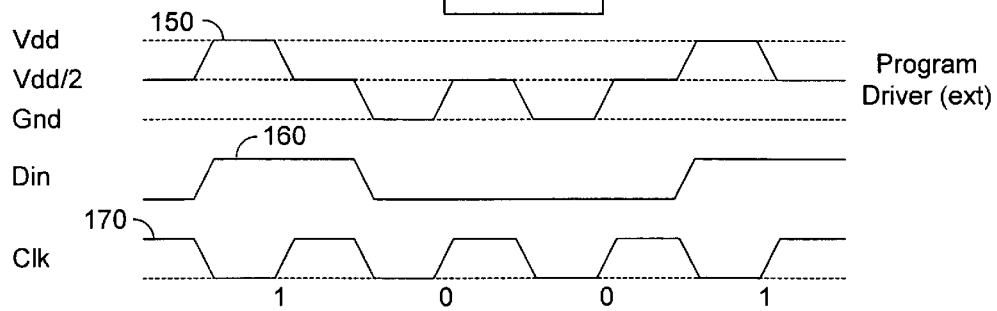
FIG. 5 is a timing diagram illustrating a writing operation of the present invention.

Referring to FIG. 5, a timing diagram of a write operation of the circuit 30 is shown. A waveform 150 represents the output of the program driver at pin 40. A waveform 160 is generally a signal representing the data input presented to the input 62 of the driver control logic 32. A waveform 170 represents the clock input CLK presented to the input 64 of the driver control logic 32. The waveform 150 is shown driven between three states, a state VDD, a state VDD/2 and a state GND.

Referring back to FIG. 3, during a write operation, the data input DIN received at the input 62 of the driver control logic is converted to a signal that is presented over the bus 86 to the pin 40. The pin 40 is then coupled to the input 43 of the one-pin interface 34. Next, the information is presented to the input 48 of the shift register 36, thus forming a signal path from the data input 62 to the shift register 36.

Figure 6:
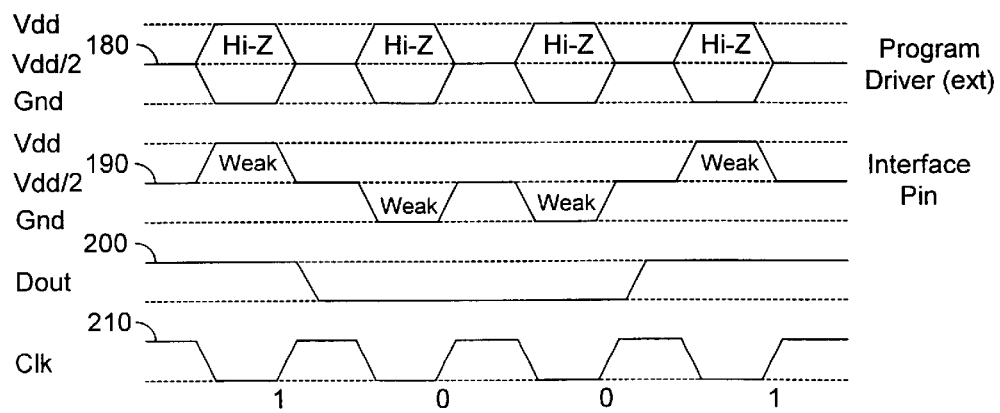
FIG. 6 is a timing diagram of a reading operation of the present invention.

Referring to FIG. 6, a read operation of the circuit 30 is shown. A waveform 180 is shown representing the output of the driver control logic. A waveform 190 is shown representing the output of the pin 40. A waveform 200 is shown representing the output DOUT and a waveform 210 is shown representing the clock signal CLK. During a read operation the pin 40 is driven to the level VDD/2 and then released by the three state programmer 38. After the pin 40 is released, the shift register data signal DOUT is buffered by a weak pad, causing the signal pin 40 to assert the shift register data. After capturing the data state, the pin 40 is again driven to the state VDD/2, causing the internal clock signal to shift the next bit of data from the shift register 36. In one embodiment, the external driver is much stronger than the weak output driver comprised of the transistors 102 and 104. In one example, the external driver may be ten times as strong as the weak output driver. However, other ratios may be implemented to meet the design criteria of a particular application.

Referring back to FIG. 3, when data is read from the shift register 36, the data is first presented from the data dout at output 50 to the input 52 of the one-pin interface 34 and then to the pin 40. The signal is then presented over the bus 86, through the buffer 84, to present the output DOUT of the buffer 84.

The three state receiver 144 and the latch 142 may be implemented several other ways. The three state receiver 144 could be implemented using devices referenced by their threshold voltage Vt instead of ratioed inverters 106 and 108. The three state receiver 144 could be implemented with conventional differential comparators using reference voltages. Additionally, hysteresis could be added to the comparators as well as other types of positive feedback to reduce noise effects. The latch 142 could be implemented with several other types of gates, or could be implemented as an input buffer with a threshold of VDD/2.

The external interface circuit and the driver control logic 32 may be implemented in a variety of ways. The inputs to the buffers could be driven, for example, with a modified enabling logic. Open drain/collector devices may replace the three-state buffers 72 and 76. The driver control logic 32 could be implemented in a variety of ways including software control of the two enable signals $EN_{13}$ HI and $EN_{13}$ LO via a computer or microcontroller.

While the invention has been particularly shown and described with reference to the preferred embodiments thereof, it will be understood by those skilled in the art that various changes in form and details may be made without departing from the spirit and scope of the invention.

I claim:

1. An apparatus comprising:
   a bidirectional input/output interface pin;
   an interface circuit configured to: (i) receive one or more three-level input signals from said interface pin and (ii) present one or more control signals in response to said one or more input signals; and
   a register circuit configured to: (i) receive said control signals and (ii) read or write data in response to said control signals.

2. The apparatus according to claim 1 further comprising a logic circuit configured to present said one or more input signals to said interface pin to control said interface circuit.

3. The apparatus according to claim 2 wherein said logic circuit is configured to: (i) receive one or more input signals and (ii) present two or more independent logic states to said pin.

4. The apparatus according to claim 3 wherein said logic states comprise a state VDD/2, a state VDD, a state GND or a state high-Z.

5. The apparatus according to claim 1 wherein said interface circuit further comprises:
   a receiver circuit configured to: (i) receive said control signals and (ii) present one or more outputs in response to said control signals;
   a comparator circuit configured to: (i) receive said one or more control signals and (ii) present a clock signal in response to said control signals; and
   a latch circuit configured to: (i) receive said one or more outputs from said receiver circuit and (ii) present data in response to said one or more outputs.

6. The apparatus according to claim 5 wherein said receiver circuit comprises a three level receiver circuit.

7. The apparatus according to claim 5 wherein said comparator circuit comprises a window comparator.

8. The apparatus according to claim 1 wherein said register circuit comprises a shift register.

9. The apparatus according to claim 1 wherein one or more of said control signals comprise one or more clock signals.

10. The apparatus according to claim 6 further comprising at most one input/output interface.

11. An apparatus comprising:
    means for receiving one or more three-level input signals from an interface;
    interface means for presenting one or more control signals in response to said one or more three-level input signals; and
    means for receiving said control signals and for reading or writing data in response to said control signals.

12. The apparatus according to claim 11 further comprising logic means for presenting said one or more input signals to said interface means.

13. The apparatus according to claim 12 wherein said logic means is configured to: (i) receive one or more input signals and (ii) present two or more independent logic states to said interface means.

14. The apparatus according to claim 13 wherein said logic states comprise a state VDD/2, a state VDD, a state GND or a state high-Z.

15. The apparatus according to claim 11 wherein said interface means further comprises:
    means for receiving said control signals and for presenting one or more outputs in response to said control signals;
    means for comparing said one or more signals and for presenting said clock signal in response to said control signals; and
    means for holding said one or more outputs from said receiving means and for presenting data in response to said one or more outputs.

16. The apparatus according to claim 11 wherein:
    said receiving means comprises a three level receiver;
    said comparator means comprises a window comparator; and
    said register comprises a shift register.

17. A method for reading and writing data to a register comprising the steps of:
    receiving one or more three-level signals from an interface pin;
    generating one or more control signals in response to said one or more input signals, said control signals controlling two or more operations of a register; and
    reading or writing data to said register in response to said one or more control signals.

18. The method according to claim 17 further comprising the step of:
    presenting said one or more input signals to said interface pin to control the reading or writing of data.

19. The method according to claim 18 further comprising the steps of:
    receiving one or more input signals; and
    presenting two or more independent logic states to said interface pin.

20. The method according to claim 19 further comprising the steps of:

receiving said control signals;

presenting one or more outputs in response to said control signals;

presenting a clock signal in response to said control signals; and presenting data in response to said one or more outputs.

* * * * *